(12) United States Patent
Jun et al.

(10) Patent No.: US 9,048,189 B2
(45) Date of Patent: Jun. 2, 2015

(54) PLASMA PROCESSING METHOD OF SEMICONDUCTOR MANUFACTURING APPARATUS

(75) Inventors: Hyun-Su Jun, Hwaseong-si (KR);
Ki-Sang Kim, Seongnam-si (KR);
Seung-Heong Lee, Suwon-si (KR);
Jong-Bum Kim, Seoul (KR);
Min-Woung Choi, Yongin-si (KR);
In-Joong Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 249 days.

(21) Appl. No.: 13/044,891

(22) Filed: Mar. 10, 2011

(65) Prior Publication Data

US 2011/0250758 A1 Oct. 13, 2011

(30) Foreign Application Priority Data

Apr. 8, 2010 (KR) ........................ 10-2010-0032398

(51) Int. Cl.
| H01L 21/302 | (2006.01) |
| H01L 21/461 | (2006.01) |
| H01L 21/3065 | (2006.01) |
| H01J 37/32 | (2006.01) |

(52) U.S. Cl.
CPC ....... *H01L 21/3065* (2013.01); *H01J 37/32091* (2013.01)

(58) Field of Classification Search
CPC ................. H01L 21/3065; H01L 21/32136; H01J 37/32091; H01J 37/32623
USPC .......... 438/710, 758, 9; 216/63; 257/E21.218
IPC ..................................................... H01L 21/3065
See application file for complete search history.

(56) References Cited

U.S. PATENT DOCUMENTS

| 6,527,911 B1 | 3/2003 | Yen et al. |
| 7,318,879 B2 | 1/2008 | Kwon et al. |
| 7,892,445 B1 | 2/2011 | Wei et al. |
| 2004/0074869 A1* | 4/2004 | Wang et al. ..................... 216/63 |
| 2006/0011138 A1* | 1/2006 | Kang et al. ................ 118/723 R |
| 2006/0278340 A1 | 12/2006 | Fischer |
| 2010/0154996 A1* | 6/2010 | Hudson et al. ........... 156/345.35 |
| 2011/0054661 A1* | 3/2011 | Rasnick et al. ............... 700/110 |

FOREIGN PATENT DOCUMENTS

| JP | 2005521229 | 7/2005 |
| JP | 2006-140439 | 6/2006 |
| JP | 2008544499 | 12/2008 |
| KR | 10-0790392 | 1/2008 |
| KR | 1020080021026 | 3/2008 |
| KR | 10-883948 | 2/2009 |

OTHER PUBLICATIONS

Peter Scheubert (Modelling and Diagnostics of LowPressure Plasma Discharges, Dissertaion at Technischen Universitat Munchen eingereicht, 2002, pp. 75-79).*

* cited by examiner

*Primary Examiner* — Duy Deo
*Assistant Examiner* — Mahmoud Dahimene
(74) *Attorney, Agent, or Firm* — Ellsworth IP Group PLLC

(57) ABSTRACT

Plasma processing methods of a semiconductor manufacturing apparatus which can minimize the amount of impurities adhered to the surface of a wafer, when a desired process using plasma is performed. According to the plasma processing methods of the semiconductor manufacturing apparatus, after the desired process is completed, the plasma generated over the wafer is diffused, and then the wafer is de-chucked.

14 Claims, 9 Drawing Sheets

PLASMA PROCESSING METHOD OF SEMICONDUCTOR MANUFACTURING APPARATUS

CROSS-REFERENCE TO RELATED APPLICATIONS

This application claims priority under 35 U.S.C. §119 to Korean Patent Application No. 10-2010-0032398 filed on Apr. 8, 2010, the disclosure of which is hereby incorporated by reference in their entirety.

BACKGROUND

1. Field of the Inventive Concept

Embodiments of the inventive concept relate to a plasma processing method of a semiconductor manufacturing apparatus which carries out a series of processes using plasma.

2. Description of the Related Art

Semiconductor devices are manufactured through a series of processing operations. This series of processing operations includes an etching operation, a deposition operation, and a cleaning operation. The deposition and etching operations may be carried out using plasma. In particular, a dry etching operation using plasma is commonly used in a process of manufacturing a semiconductor device, due to the limitation in the integration degree of wet etching.

SUMMARY

Embodiments of the inventive concept provide a plasma processing method of a semiconductor manufacturing apparatus which can minimize the amount of impurities adhered to a surface of a wafer in some operations using a plasma such as deposition, etching or the like.

Additional features and utilities of the present general inventive concept will be set forth in part in the description which follows and, in part, will be obvious from the description, or may be learned by practice of the present general inventive concept.

Exemplary embodiments of the present inventive concept provide a plasma processing method of a semiconductor manufacturing apparatus, the method including: chucking a wafer in a process chamber; generating a plasma over the wafer to perform a desired process; after the desired process is completed, diffusing the plasma by controlling process conditions; and de-chucking the wafer.

In an embodiment, a plasma generation region may be confined over the wafer, and the plasma may be generated in the plasma generation region to perform the desired process. After the desired process is completed, the plasma generation region may be expanded to diffuse the plasma, and then the wafer may be de-chucked.

In another embodiment, after the desired process is completed, an internal pressure of the process chamber may be lowered to diffuse the plasma.

In still another embodiment, after the desired process is completed, a flow rate of reaction gas which is supplied into the process chamber may be decreased to lower the internal pressure of the process chamber.

In yet another embodiment, after the desired process is completed, an exhaust amount of the process chamber may be increased to lower the internal pressure of the process chamber.

In yet another embodiment, the desired process may be performed by generating a first plasma over the wafer. After the desired process is completed, a second plasma may be generated by changing the reaction gas, and then, the second plasma may be diffused by controlling the process conditions. The wafer may then be de-chucked.

In yet another embodiment, the second plasma may use any one of argon, nitrogen and oxygen as the reaction gas.

In yet another embodiment, the wafer may be positioned inside the process chamber, and the wafer may be chucked on an electrostatic chuck using an electrostatic force.

Exemplary embodiments of the present inventive concept may also provide a plasma processing method of a semiconductor manufacturing apparatus, the method including: chucking a wafer on a support chuck positioned inside a process chamber; confining a plasma generation region over the waver using a confinement assembly; generating a first plasma in the plasma generation region to perform a desired process; after the desired process is completed, generating a second plasma in the plasma generation region by changing a reaction gas; diffusing the second plasma by extending the plasma generation region; and de-chucking the wafer.

In an embodiment, the process chamber may include a first electrode positioned opposite to the support chuck, and a second electrode positioned inside the support chuck. The plasma generation region may be confined between the first electrode and the support chuck using the confinement assembly.

In another embodiment, the confinement assembly may include a plurality of confinement rings, a shaft attached with the confinement rings, and a driving member to move the confinement rings. The confinement rings may be arranged at a constant interval between a side of the first electrode and a side of the support chuck to confine the plasma generation region.

In still another embodiment, after the desired process is completed, the plasma generation region may be extended by moving the confinement rings such that the confinement rings are collected at the side of the first electrode.

In yet another embodiment, after the desired process is completed, the second electrode may apply a predetermined bias electric power.

In yet another embodiment, the support chuck may be an electrostatic chuck using electrostatic force. The plasma processing method may further include interrupting a predetermined voltage for the electrostatic force, after the desired process is completed.

In yet another embodiment, de-chucking the wafer includes spacing the wafer from the support chuck.

Exemplary embodiments of the inventive concept may also provide a plasma processing method of a semiconductor manufacturing apparatus, the method including: chucking a wafer on a support chuck positioned inside a process chamber; generating a first plasma over the wafer to perform a desired process; after the desired process is completed, generating a second plasma over the wafer by changing reaction gas; diffusing the second plasma by lowering an internal pressure of the process chamber; and de-chucking the wafer.

In an embodiment, after the desired process is completed, the internal pressure of the process chamber may be lowered by increasing a ratio of an inflow rate and an exhaust rate in the process chamber.

In another embodiment, after the desired process is completed, the ratio of the inflow rate and the exhaust rate in the process chamber may be increased by decreasing a flow rate of the reaction gas flowing in the process chamber.

In still another embodiment, after the desired process is completed, the ratio of the inflow rate and the exhaust rate in the process chamber may be increased by increasing an exhaust amount of the process chamber.

In yet another embodiment, the desired process may be a dry etching process using a plasma.

Exemplary embodiments of the inventive concept may also provide a plasma processing method of a semiconductor manufacturing apparatus, the method including: chucking a wafer within a predetermined region of a process chamber; generating a plasma within the predetermined region to perform a desired process; and changing an internal pressure of the predetermined region of the process chamber after completion of the desired process.

The changing the internal pressure of the predetermined region of the process chamber may include increasing a ratio of an inflow rate to an outflow rate of the predetermined region.

The predetermined region can be a region confined by an upper electrode, a support chuck and walls of the process chamber.

Exemplary embodiments of the inventive concept may also provide a plasma processing method of a semiconductor manufacturing apparatus, the method including chucking a wafer within a process area of a process chamber; generating a plasma within the process area to perform a desired process; and altering the process area upon completion of the desired process.

The process area can be altered by expanding a size of the process area.

The process area can be expanded by operating a confinement assembly.

The process area can be altered by decreasing an internal pressure of the process area.

BRIEF DESCRIPTION OF THE DRAWINGS

The foregoing and other features and utilities of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. The following is a description of exemplary embodiments of the inventive concept, while referring to the drawings.

DETAILED DESCRIPTION OF THE EMBODIMENTS

Figure 1A:
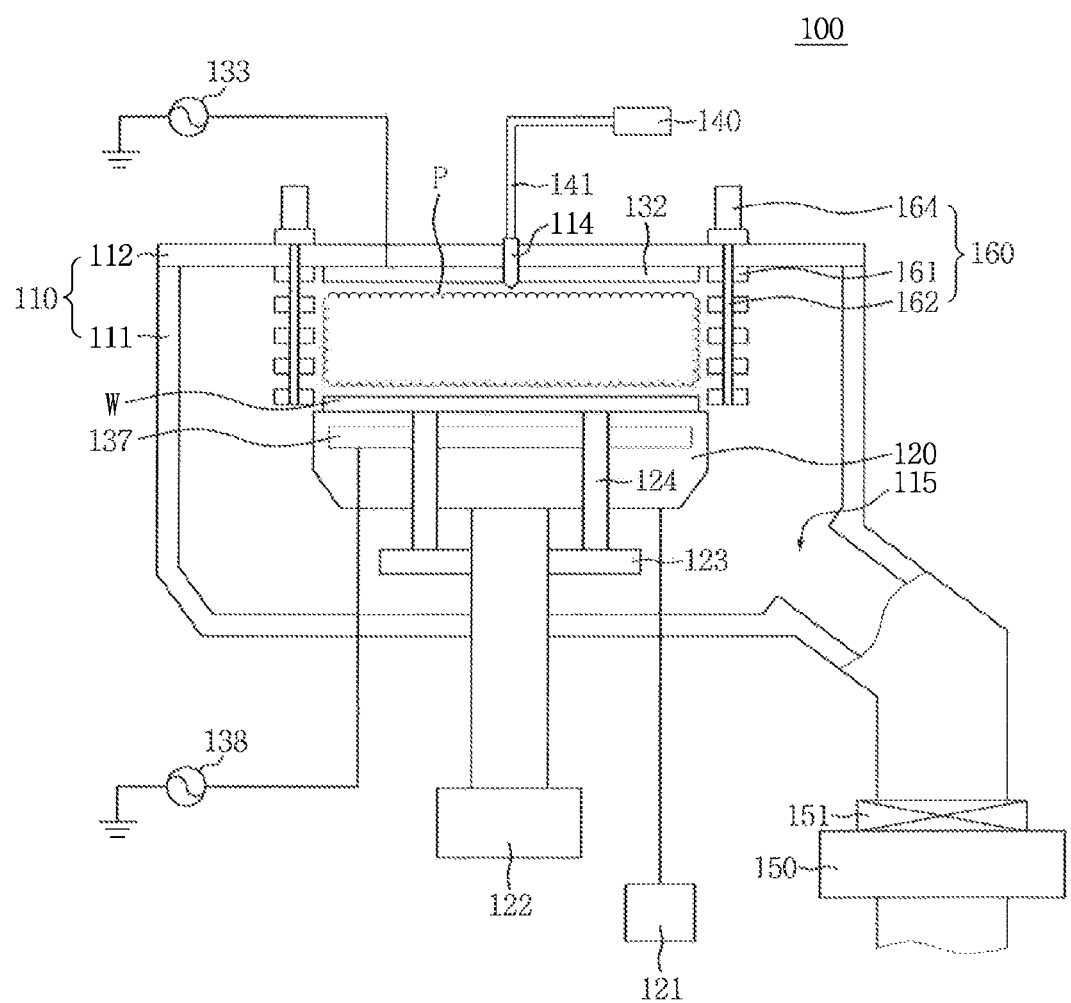
FIGS. 1A and 1B are cross-sectional views of a semiconductor manufacturing apparatus to which a plasma processing method according to an embodiment of the inventive concept is applied.

Various embodiments will now be described more fully with reference to the accompanying drawings in which various embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
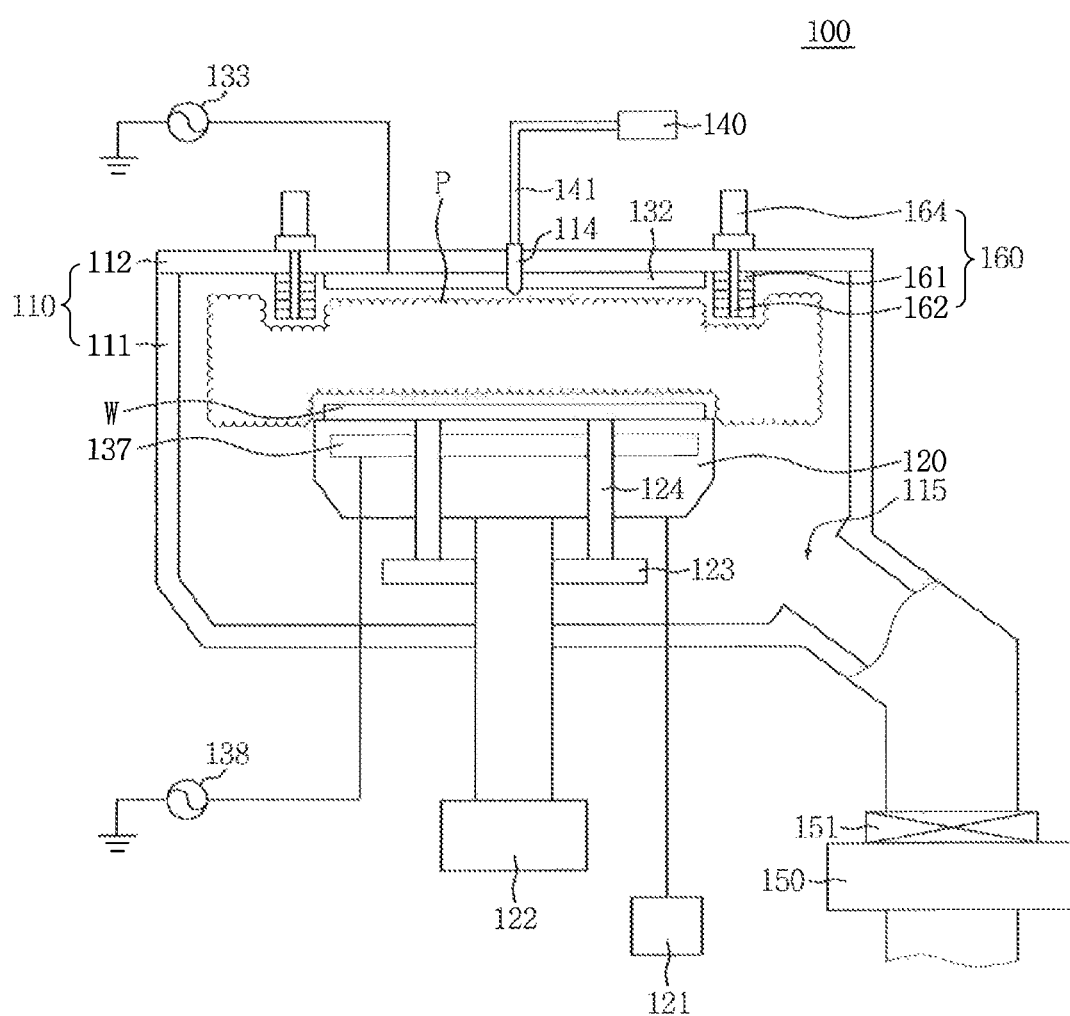

FIGS. 1A and 1B are cross-sectional views of a semiconductor manufacturing apparatus to which a plasma processing method according to an exemplary embodiment of the inventive concept is applied. More specifically, FIG. 1A is a cross-sectional view of the semiconductor manufacturing apparatus during which time a desired process is being performed. FIG. 1B is a cross-sectional view of the semiconductor manufacturing apparatus after the desired process of FIG. 1A is completed.

Referring to FIGS. 1A and 1B, a semiconductor manufacturing apparatus 100 to which a plasma processing method according to an exemplary embodiment of the inventive concept is applied includes a process chamber 110, a reaction gas supply member 140, and an exhaust pump 150. The reaction gas supply member 140 is connected to a reaction gas injection member 114 of the process chamber 110 via a supply line 141. The exhaust pump 150 is connected to an exhaust pipe 115 of the process chamber 110.

The semiconductor manufacturing apparatus 100 to which the plasma processing method according to the present embodiment of the inventive concept is applied may further include an exhaust amount control member 151 interposed between the exhaust pipe 115 and the exhaust pump 150. The exhaust amount control member 151 can maintain an internal pressure of the process chamber 110 within a predetermined range.

The process chamber 110 provides a space in which a desired process using the plasma is performed. The process chamber 110 includes a support chuck 120 to chuck a wafer W, and a first electrode 132 and a second electrode 137 to generate the plasma. The first electrode 132 may be positioned opposite to the support chuck 120. In addition, the second electrode 137 may be positioned inside the support chuck 120.

The process chamber 110 may include a body 111 having the exhaust pipe 115, and a cover 112 connected to the body 111 and having the reaction gas injection member 114, and the support chuck 120 is positioned in the process chamber 110. The first electrode 132 may be positioned in the cover 112.

The support chuck 120 chucks the wafer W while the desired process is performed. The support chuck 120 may cool the wafer W which comes into contact with the hot plasma. To this end, the support chuck 120 may inject helium gas between the wafer W and the support chuck 120. In this instance, the support chuck 120 is connected to a helium gas feeding member 122 to feed the helium gas to the support chuck 120.

The support chuck 120 may prevent the wafer W from being spaced apart from the support chuck 120 due to the helium gas. To this end, the support chuck 120 may be an electrostatic chuck to support the wafer W by using an electrostatic force. In this instance, the support chuck 120 is connected to a high-voltage supply member 121 to supply the electrostatic force.

The high-voltage supply member 121 may supply a voltage of about 400 V to chuck the wafer W stably. The support chuck 120 may eliminate the electrostatic force in order to de-chuck the wafer W after the desired process is completed. To this end, the high-voltage supply member 121 may interrupt the voltage to be supplied to the support chuck 120 after the desired process is completed.

The first electrode 132 and the second electrode 137 supply a predetermined voltage to generate the plasma. To this end, the first electrode 132 and the second electrode 137 may be connected to a first voltage source 133 and a second voltage source 138, respectively. Alternatively, any one of the first electrode 132 and the second electrode 137 may be connected to a ground or a reference voltage source. The voltage supplied from the first voltage source 133 and the second voltage source 138 may be a high frequency voltage.

The process chamber 110 further includes a confinement assembly 160 to define a plasma generation region P in which the plasma is generated. The confinement assembly 160 has a plurality of confinement rings 161, a shaft 162 attached with the confinement rings 161, and a driving member 164 to drive the confinement rings 161.

The confinement rings 161 are moved by the driving member 164 to confine the plasma generation region P. The plasma generation region P may be confined between the support chuck 120 and the first electrode 132. To this end, the confinement rings 161 may be arranged at a predetermined interval between a side of the first electrode 132 and a side of the support chuck 120, as shown in FIG. 1A.

The confinement rings 161 confine the plasma generation region P by neutralizing particles of the process gas of a plasma state. The confinement rings 161 may be made of a dielectric material such as silica or quartz. Since the confining principle of the plasma generation region P is disclosed in detail in U.S. Pat. No. 5,534,751 and U.S. Pat. No. 6,527,911, the detailed description thereof will not be described herein.

The shaft 162 supports the confinement rings 161 such that the confinement rings 161 include holes therethrough which are aligned to provide a passage through which the shaft 162 passes. The shaft 162 may be made of a lightweight, low particulate-generating substance such as nylon. The shaft 162 may be moved together with the confinement rings 161 by the driving member 164.

The driving member 164 moves the confinement rings 161 in accordance with the progress of the desired process. More specifically, the driving member 164 arranges the confinement rings 161 at a predetermined interval, as shown in FIG. 1A, while the desired process is performed. As a result, the plasma generation region P is confined while the desired process is performed. Next, the driving member 164 moves the confinement rings 161 so that the confinement rings 161 are collected at the side of the first electrode 132, as shown in FIG. 1B, after the desired process is completed. Therefore, after the desired process is completed, the plasma generation region P is relatively extended as compared to that at the time of performing the desired process.

The semiconductor manufacturing apparatus 100 to which the plasma processing method according to the present embodiment of the inventive concept is applied may further include a lift 123 to stably chuck and de-chuck the wafer W. The lift 123 supports a rear surface of the wafer W using lift pins 124 which penetrate the support chuck 120.

Figure 2A:
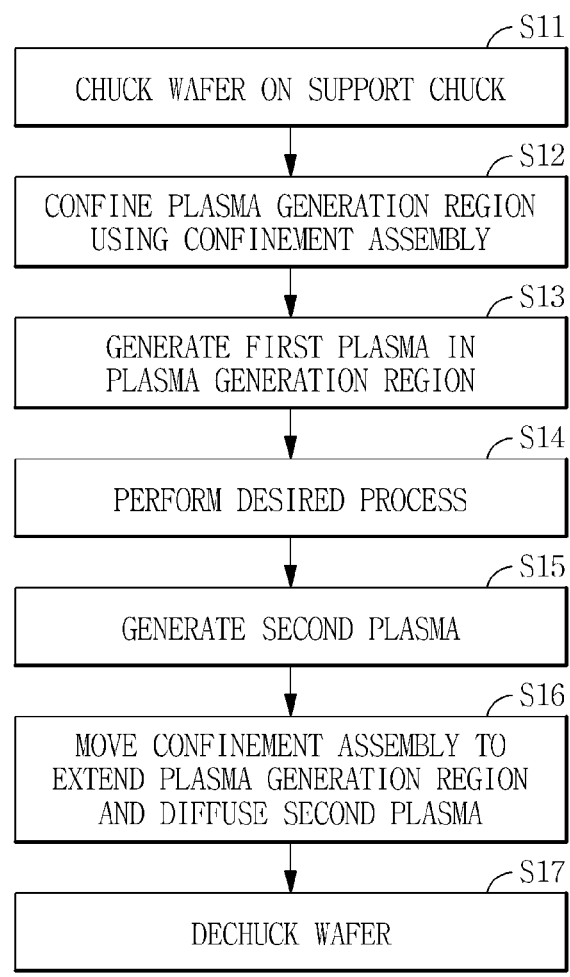
FIGS. 2A and 2B are flowcharts illustrating a plasma processing method of a semiconductor manufacturing apparatus according to embodiments of the inventive concept.

FIG. 2A is a flowchart illustrating a plasma processing method of a semiconductor manufacturing apparatus according to an embodiment of the inventive concept.

The plasma processing method of the semiconductor manufacturing apparatus according to the present embodiment of the inventive concept will be now described with reference to FIGS. 1A, 1B and 2A. First, a wafer W is chucked on a support chuck 120 which is positioned inside a process chamber 110 (operation S11). The support chuck 120 is connected to a high-voltage supply member 121, and may be an electrostatic chuck using an electrostatic force. The chucking process of the wafer W can be more stably performed using lift pins 124 of a lift 123.

Next, a plasma generation region P is confined using a confinement assembly 160 (operation S12). More specifically, as shown in FIG. 1A, a plurality of confinement rings 161 are arranged at a predetermined interval between a side of a first electrode 132 and a side of the support chuck 120. As a result, the plasma generation region P is confined between the first electrode 132 and the support chuck 120.

Then, a reaction gas is injected in the plasma generation region P, and a predetermined voltage is applied between the first electrode 132 and a second electrode 137. As a result, the first plasma is generated in the plasma generation region P (operation S13). A high frequency voltage can be applied to the first electrode 132 and the second electrode 137. In addition, one of the first electrode 132 and the second electrode 137 may be connected to a ground or reference voltage source. In this instance, the other is applied with a voltage to generate the first plasma.

A desired process is performed using the first plasma which is generated in the plasma generation region P (operation S14). The desired process may be a dry etching process using plasma.

After the desired process is completed, the reaction gas supplied to the process chamber 110 is changed to generate the second plasma in the plasma generation region P (operation S15). The second plasma neutralizes and discharges electric charges remaining in the wafer W and the process chamber 110. Accordingly, the second plasma may use any one of argon Ar, nitrogen $N_2$, and oxygen $O_2$ as the reaction gas. A predetermined bias voltage may be applied to the second electrode 137 positioned in the support chuck 120. The predetermined bias voltage applied to the second electrode 137 enables the wafer W to be easily discharged.

Figure 2B:
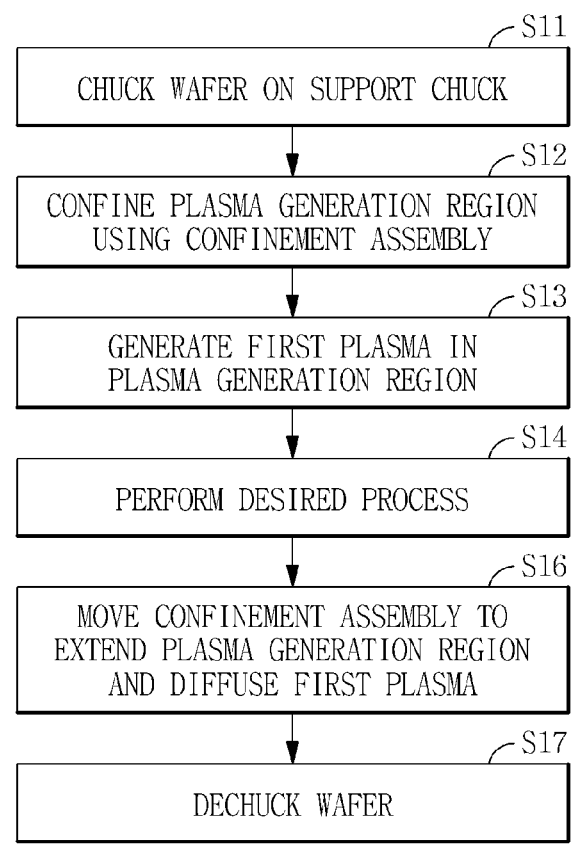

The plasma processing method of the semiconductor manufacturing apparatus according to the present embodiment of the inventive concept generates the second plasma by changing the reaction gas after the desired process is completed, as illustrated in FIG. 2A. The plasma processing method may alternatively be performed without generating the second plasma, as illustrated in FIG. 2B.

If the support chuck 120 is an electrostatic chuck using an electrostatic force, the support chuck 120 eliminates the electrostatic force after the desired process is completed. More specifically, the high-voltage supply member 121 eliminates the electrostatic force by interrupting the high voltage which is supplied to the support chuck 120. As a result, it is possible to easily de-chuck the wafer W which is chucked on the support chuck 120, i.e., the electrostatic chuck.

The plasma generation region P is extended by moving the confinement rings 161 to diffuse the first or the second plasma (operation S16), depending on whether the second plasma is generated. More specifically, as shown in FIG. 1B, the confinement rings 161 are moved to be collected at the side of the first electrode 132, thereby extending the plasma generation region P. The driving member 164 can retract the confinement rings 161 to provide for an expanded plasma generation region P. The retraction of the confinement rings 161 allows the first or the second plasma to easily diffuse.

In addition, the shaft 162 of the confinement assembly 160 can be moved to be retracted at the side of the first electrode 132 together with the confinement rings 161.

The plasma processing method can move the confinement rings 161 using the driving member 164 of the confinement assembly 160 in such a way that the confinement rings 161 are collected at the side of the support chuck 120.

Afterward, the wafer W is de-chucked (operation S17). The process of de-chucking the wafer W may include spacing the wafer W from the support chuck 120 using the lift pins 124 of the lift 123.

Generally, in the case of performing a desired process using plasma, impurities may be created in the process chamber 110. The impurities are charged with negative electric charges by the plasma. The charged impurities are confined in the plasma by a high energy barrier of the plasma. Accordingly, the charged impurities do not escape together with un-reacted gases toward the exhaust pipe. The charged impurities confined in the plasma are adhered to the surface of the wafer W in the process of de-chucking the wafer W.

The plasma processing method described above diffuses the first or the second plasma before the wafer W is de-chucked. The diffusion of the first or the second plasma lowers the energy barrier of the plasma. In addition, the diffusion of the first or second plasma causes the charged impurities, which are confined in the plasma, to diffuse. Accordingly, in the process of de-chucking the wafer W, it is possible to minimize the amount of the impurities adhered to the surface of the wafer W.

Figure 3A:
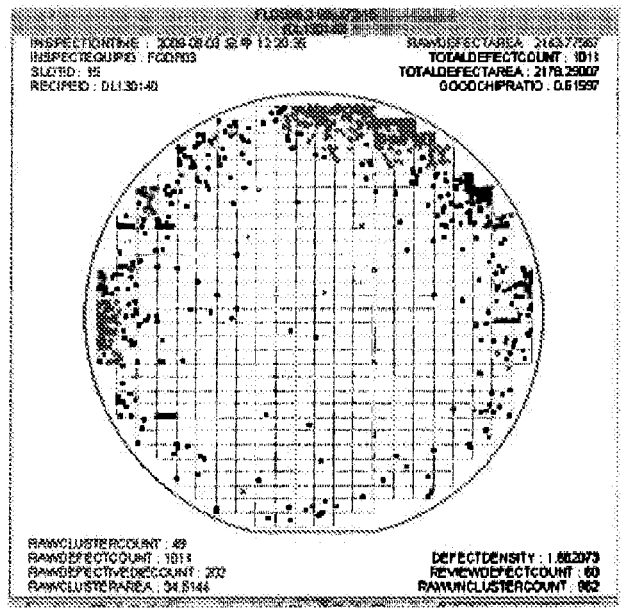
FIG. 3A is a photograph taken from a surface of a wafer in a case where the wafer is de-chucked without diffusing plasma, after a desired process using plasma is completed.
Figure 3B:
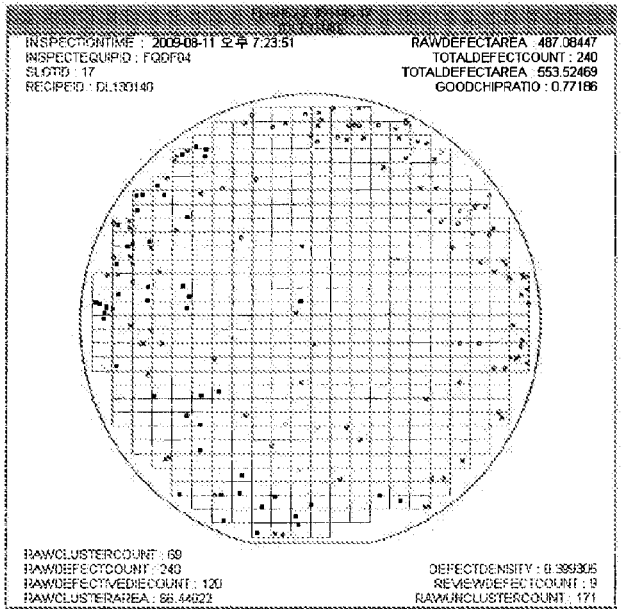
FIG. 3B is a photograph taken from a surface of a wafer in a case where plasma is diffused and then the wafer is de-chucked, after a desired process using plasma is completed.

FIGS. 3A and 3B are photographs taken from the surface of a de-chucked wafer after a desired process using plasma is completed. More specifically, FIG. 3A is a photograph taken from the surface of the wafer in a case where the wafer is de-chucked without diffusing the plasma, after the desired process completed. FIG. 3B is a photograph taken from the surface of the wafer in a case where the plasma is diffused and then the wafer is de-chucked, after the desired process is completed.

Referring to FIGS. 3A and 3B, it can be seen that a relatively small amount of the impurities is adhered in the case where the plasma is diffused and then the wafer is de-chucked after the desired process is completed, compared to that in the case where the wafer is de-chucked without the diffusion of the plasma.

Figure 4A:
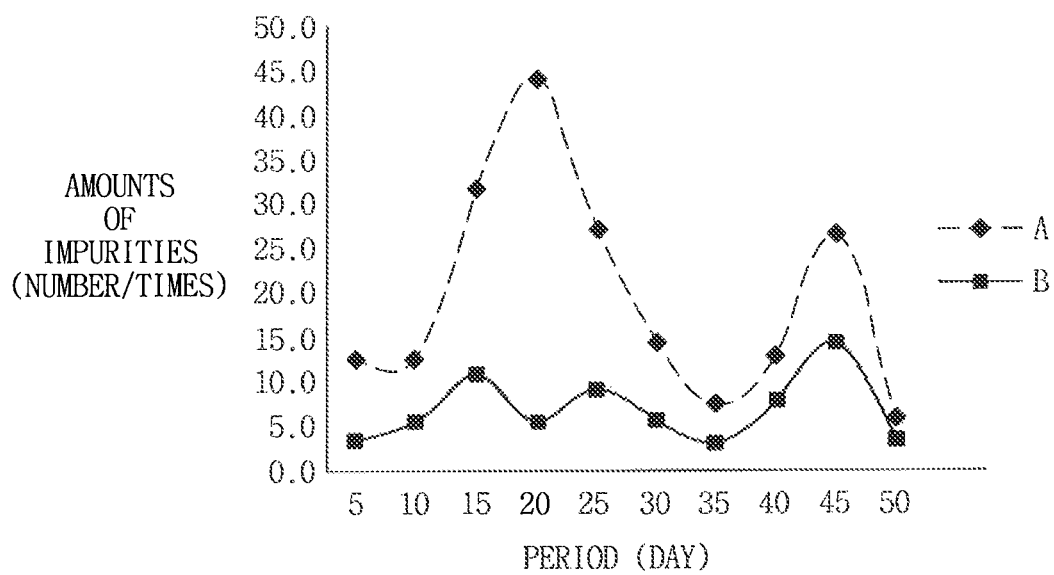
FIG. 4A is a graph showing an average amount of impurities adhered to a surface of a wafer according to existence of a plasma diffusion process.

FIG. 4A is a graph showing an average amount of impurities, which are adhered to the surface of a wafer manufactured by a semiconductor manufacturing apparatus using plasma, in intervals of 5 days. More specifically, FIG. 4A is a graph showing the average amounts of impurities which are adhered to the surface of the wafer, in the case (A) where the plasma diffusion process is not performed and the case (B) where the plasma diffusion process is performed. The semiconductor manufacturing apparatus can perform the plasma processing processes several times a day. The average amount of the impurities means the average amount of the impurities adhered to the surface of the wafer per one cycle of a plasma processing process.

Referring to FIG. 4A, it can be seen that a relatively large amount of the impurities is adhered to the surface of the wafer, in the case (A) where the wafer is de-chucked without diffusing the plasma after the desired process is performed. That is, it can be seen that the average amount of the impurities adhered to the surface of the wafer is minimized by de-chucking the wafer after the plasma is diffused.

Figure 4B:
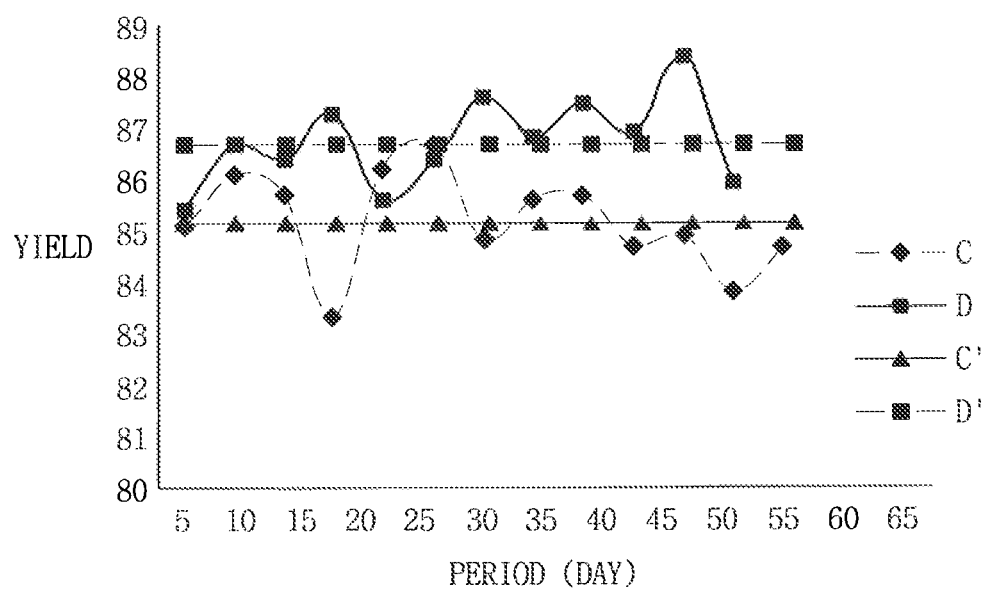
FIG. 4B is a graph showing an average yield of a wafer according to existence of a plasma diffusion process.

In addition, FIG. 4B is a graph showing an average yield variation of the wafer manufactured by the semiconductor manufacturing apparatus using plasma. More specifically, FIG. 4B is a graph showing variations in average yield of the impurities in groups of 5 days, in a case (C) where the plasma diffusion process is not performed and a case (D) in which the plasma diffusion process is performed. The semiconductor manufacturing apparatus can perform the plasma processing processes several times a day. The wafer yield means an average wafer yield per one cycle of a plasma processing process for each day.

Referring to FIG. 4B, it can be seen that relatively low yield of the wafer is obtained, in the case (C) where the wafer is de-chucked without diffusing the plasma after the desired process is performed. In addition, it can be seen that the average yield (D') of the wafer is relatively higher than that in the case (C') where the plasma is not diffused before de-chucking the wafer. That is, it can be seen that the average yield of the wafer can be improved by de-chucking the wafer after the plasma is diffused.

Referring to FIGS. 3A, 3B, 4A and 4B, consequently, it can be seen that by diffusing the plasma and then de-chucking the wafer after the desired process using plasma is performed, the amount of the impurities adhered to the surface of the wafer can be minimized and the average yield of the wafers can be improved.

As a result, in the plasma processing method of the semiconductor manufacturing apparatus according to the present embodiment of the inventive concept, the plasma generation region is confined over the wafer, and after the desired process using plasma is completed, the plasma generation region is extended to diffuse the plasma to a larger area. Therefore, the plasma processing method of the semiconductor manufacturing apparatus according to the present embodiment of the inventive concept minimizes the amount of the impurities adhered to the surface of the wafer. In addition, the plasma processing method of the present embodiment can improve the average yield of the wafer.

Figure 5:
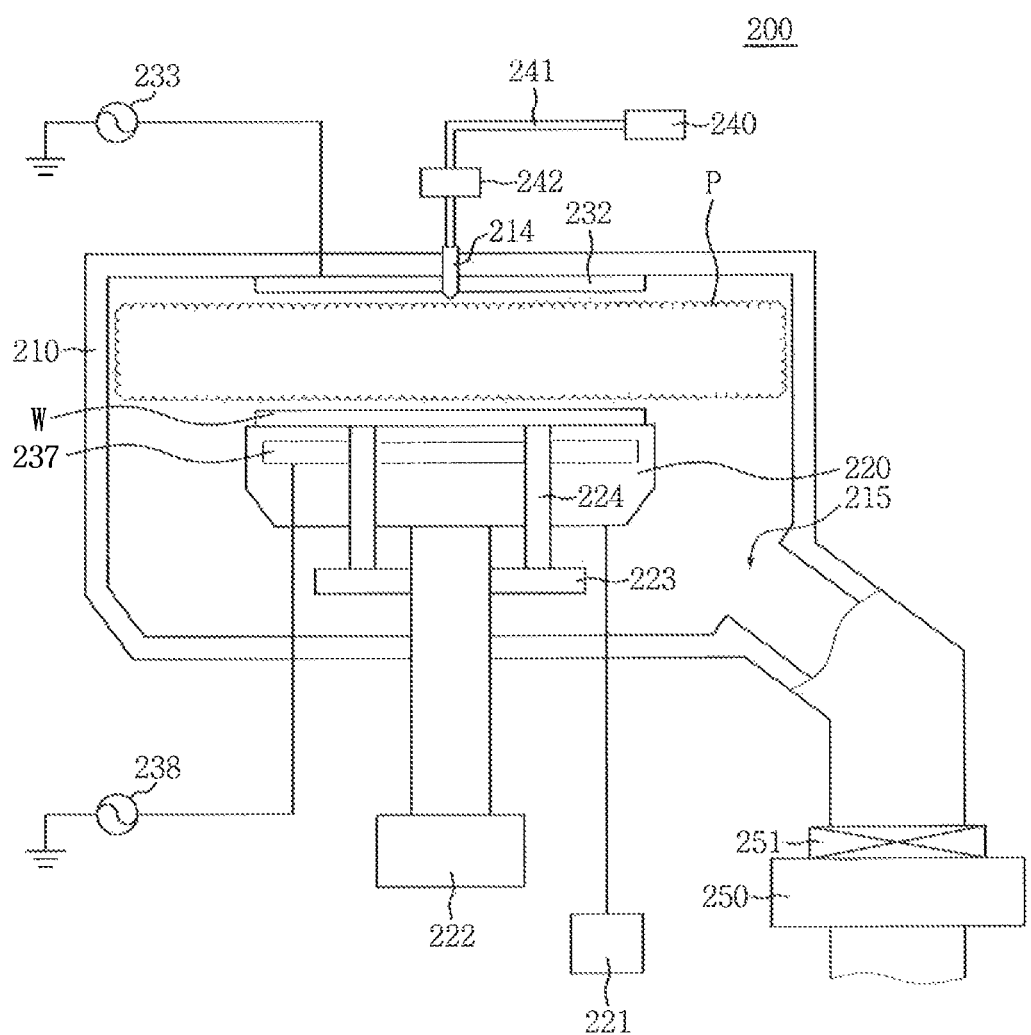
FIG. 5 is a cross-sectional view of a semiconductor manufacturing apparatus to which a plasma processing method according to another embodiment of the inventive concept is applied.

FIG. 5 is a cross-sectional view of a semiconductor manufacturing apparatus to which a plasma processing method according to another embodiment of the present inventive concept is applied.

Referring to FIG. 5, a semiconductor manufacturing apparatus 200 to which a plasma processing method according to the present embodiment of the inventive concept is applied includes a process chamber 210, a reaction gas supply member 240, an exhaust pump 250, a flow rate control member 242, and an exhaust amount control member 251.

The reaction gas supply member 240 is connected to a reaction gas injection member 214 of the process chamber 210. The exhaust pump 250 is connected to an exhaust pipe 215 of the process chamber 210.

The process chamber 210 provides a space in which a desired process using plasma is performed. The process chamber 210 includes a support chuck 220 to chuck a wafer W, and a first electrode 232 and a second electrode 237 to generate the plasma. The first electrode 232 may be positioned opposite to the support chuck 220. In addition, the second electrode 237 may be positioned inside the support chuck 220.

The support chuck 220 chucks the wafer W while the desired process is performed. The support chuck 220 may cool the wafer W which comes into contact with the hot plasma. To this end, a helium gas feeding member 222 can supply helium gas to the support chuck 220, which may in turn inject helium gas between the wafer W and the support chuck 220. In this instance, the support chuck 220 is connected to the helium gas feeding member 222 to feed the helium gas.

The support chuck 220 may prevent the wafer W from being spaced apart from the support chuck 220 due to the helium gas. To this end, the support chuck 220 may be an electrostatic chuck to support the wafer W using electrostatic force. In this instance, the support chuck 220 is connected to a high-voltage supply member 221 for the electrostatic force.

The high-voltage supply member 221 may supply a voltage of about 400 V to chuck the wafer W stably. The support chuck 120 may eliminate the electrostatic force in order to de-chuck the wafer W after the desired process is completed. To this end, the high-voltage supply member 221 may interrupt the voltage to be supplied to the support chuck 220 after the desired process is completed.

The first electrode 232 and the second electrode 237 supply a predetermined voltage to generate the plasma. To this end, the first electrode 232 and the second electrode 237 may be connected to a first voltage source 233 and a second voltage source 238, respectively. Alternatively, any one of the first electrode 232 and the second electrode 237 may be connected to a ground or reference voltage source. The voltage supplied from the first voltage source 233 and the second voltage source 238 may be a high frequency voltage.

The flow rate control member 242 controls the flow rate of reaction gas flowing in the process chamber 210. To this end, the flow rate control member 242 is positioned along a supply line 241 which connects the reaction gas supply member 240 with the process chamber 210.

The exhaust amount control member 251 controls the exhaust amount of the reaction gas discharged from the process chamber 210. To this end, the exhaust amount control member 251 is interposed between the process chamber 210 and the exhaust pump 250.

The semiconductor manufacturing apparatus 200 to which the plasma processing method according to the embodiment of FIG. 5 is applied may further include a lift 223 to stably chuck and de-chuck the wafer W. The lift 223 supports a rear surface of the wafer W using lift pins 224 which penetrate the support chuck 220.

Figure 6A:
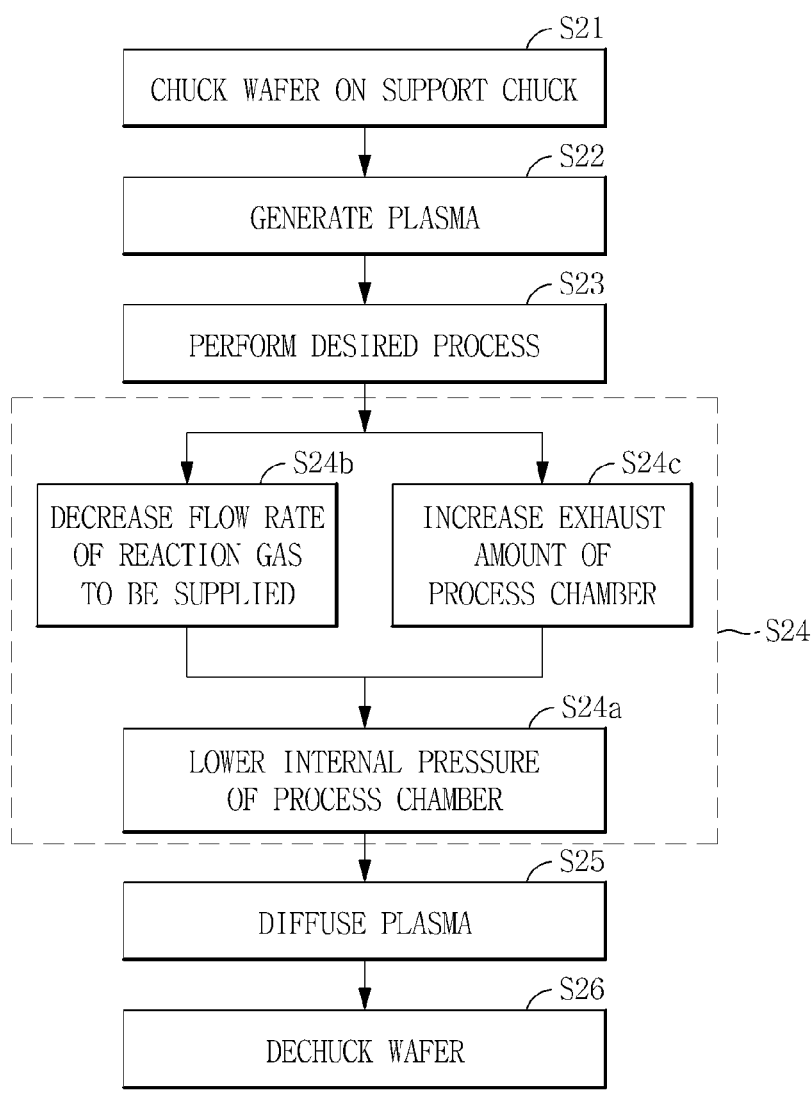
FIGS. 6A and 6B are flowcharts illustrating a plasma processing method of a semiconductor manufacturing apparatus according to embodiments of the inventive concept.

FIG. 6A is a flowchart illustrating a plasma processing method of a semiconductor manufacturing apparatus according to another embodiment of the general inventive concept.

A plasma processing method of a semiconductor manufacturing apparatus according to the present embodiment of the inventive concept will be now described with reference to FIGS. 5 and 6A. First, a wafer W is chucked on a support chuck 220 which is positioned inside a process chamber 210 (operation S21). The support chuck 220 is connected to a high-voltage supply member 221, and may be an electrostatic chuck using an electrostatic force. The chucking process of the wafer W may be more stably performed using lift pins 224 of a lift 223.

Next, the reaction gas is injected in the process chamber 210 by the reaction gas supply member 240, and a predetermined voltage is applied between the first electrode 232 and the second electrode 237. As a result, a plasma is generated in the process chamber 210 (operation S22). The high frequency voltage may be applied to the first electrode 232 and the second electrode 127. In addition, one of the first electrode 232 and the second electrode 237 may be connected to a ground or a reference voltage source. In this instance, the other of the electrodes is applied with a voltage to generate the plasma.

Since the plasma processing method of the semiconductor manufacturing apparatus according to the embodiment of FIG. 6A is not limited to the plasma generation region P describe supra, as shown in FIG. 5, the plasma generation region P of this embodiment is defined by the support chuck 220, the first electrode 232, and an inner wall of the process chamber 210.

And, a desired process is performed using the generated plasma (operation S23). The desired process may be a dry etching process using plasma.

After the desired process is completed, a process condition is controlled (operation S24), and the generated plasma is diffused (operation S25). More specifically, the internal pressure of the process chamber 210 is lowered by controlling the process condition (operation S24a), and the generated plasma is diffused (operation S25).

The decreased internal pressure (operation S24a) of the process chamber 210 may be achieved by increasing a ratio of inflow rate and exhaust rate in the process chamber 210. The increased ratio of inflow rate and exhaust rate in the process chamber 210 may be achieved by decreasing a flow rate of the reaction gas flowing in the process chamber 210 (operation S24b). The flow rate of the reaction gas is controlled by the flow rate control member 242 which is positioned along the supply line 241.

The increased ratio of inflow rate and exhaust rate in the process chamber 210 may be achieved by increasing the exhaust amount of the process chamber 210 (operation S24c). The exhaust amount of the process chamber 210 is controlled by the exhaust amount control member 251 positioned between the exhaust pipe 215 of the process chamber 210 and the exhaust pump 250.

Generally, the relaxation length of plasma having electrons of constant velocity is determined by the following Equation 1:

$$\lambda_\varepsilon(v) = \frac{v}{\sqrt{3 v_m v_{inel}}}$$   Equation 1

Here, $\lambda_\varepsilon$ is an electron energy relaxation length, v is an electron velocity, $v_m$ is a momentum transfer collision frequency, and $v_{inel}$ is an inelastic collision frequency.

If the internal pressure of the process chamber 210 is decreased, the momentum transfer collision frequency and the inelastic collision frequency of the plasma are decreased. If the momentum transfer collision frequency and the inelastic collision frequency of the plasma are decreased, the electron energy relaxation length of the plasma is increased to diffuse the plasma.

Figure 6B:
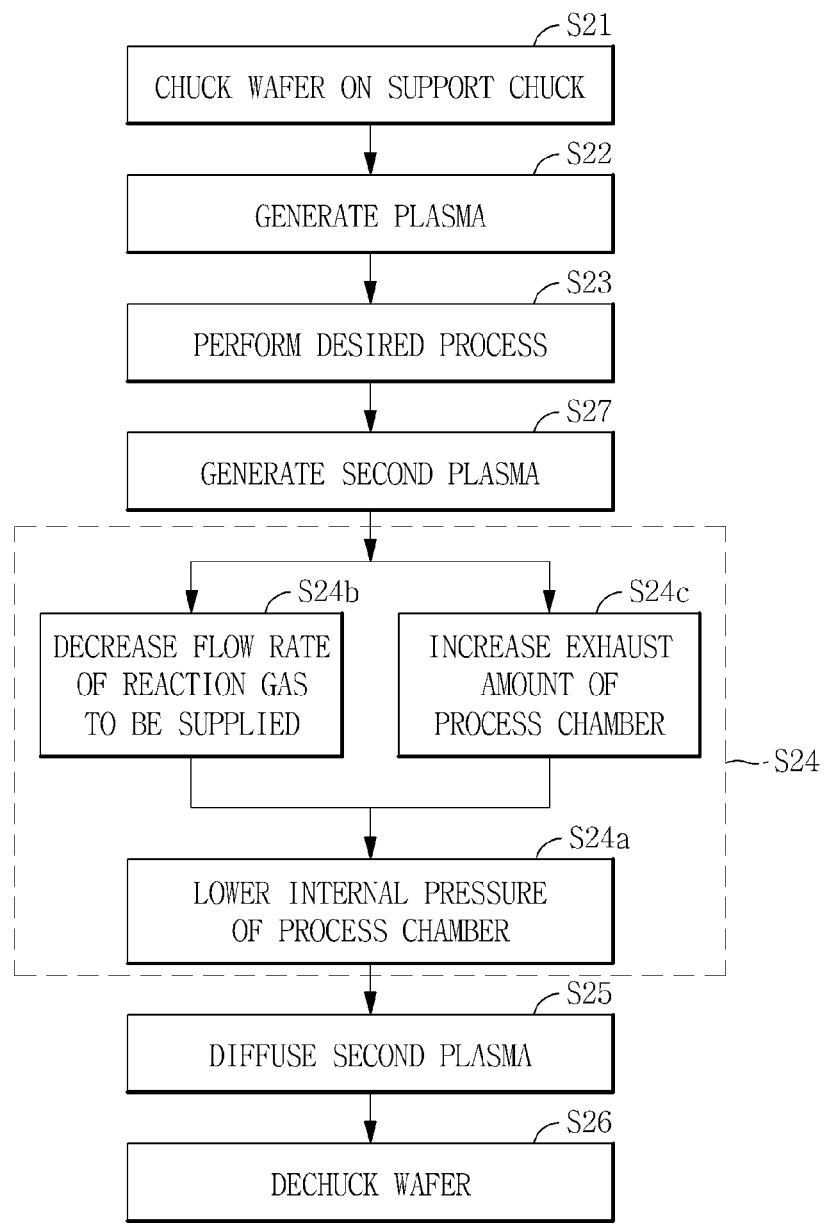

It has been described that the plasma processing method of the semiconductor manufacturing apparatus diffuses the plasma generated for the desired process after the desired process is completed, as illustrated in FIG. 6A. However, the plasma processing method of the semiconductor manufacturing apparatus may generate a second plasma by changing the reaction gas after the desired process is completed (operation S27), as illustrated in FIG. 6B, which is similar to the plasma processing method of the semiconductor manufacturing apparatus according to the embodiment of FIG. 2A.

The second plasma discharges electric charges remaining in the wafer W. The second plasma may use any one of argon (Ar), nitrogen $N_2$, and oxygen $O_2$ as the reaction gas.

If the support chuck 220 is an electrostatic chuck using an electrostatic force, the support chuck 220 eliminates the electrostatic force after the desired process is completed. More specifically, the high-voltage supply member 221 eliminates the electrostatic force by interrupting the high voltage which is supplied to the support chuck 220. As a result, it is possible to easily de-chuck the wafer W which is chucked on the support chuck 220, i.e., the electrostatic chuck.

Further, the wafer W is de-chucked (operation S27). The process of de-chucking the wafer W may include spacing the wafer W from the support chuck 220 using the lift pins 224 of the lift 223.

As a result, in the plasma processing method of the semiconductor manufacturing apparatus according to the embodiment of FIGS. 6A and 6B, after the desired process using plasma is completed, the plasma is diffused by lowering the internal pressure of the process chamber; thereby minimizing the amount of the impurities adhered to the surface of the wafer.

With the plasma processing methods of a semiconductor manufacturing apparatus according to the exemplary embodiments of the general inventive concept, after a desired process using plasma is completed, the plasma is diffused and then the wafer is de-chucked. Therefore, the plasma processing methods of a semiconductor manufacturing apparatus according to the general inventive concept can minimize the amount of the impurities adhered to the surface of the wafer due to the desired process.

The foregoing is illustrative of embodiments and is not to be construed as limiting thereof. Although a few exemplary embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A plasma processing method in a semiconductor manufacturing apparatus, the method comprising:
   chucking a wafer in a process chamber;
   generating a plasma over the wafer in a plasma generation region to perform a desired process;
   diffusing the plasma by retracting a confinement assembly in response to completing the desired process; and
   de-chucking the wafer disposed within the diffused plasma.

2. The plasma processing method of claim 1, wherein the diffusing of the plasma includes decreasing an internal pressure of the process chamber when the desired process is completed.

3. The plasma processing method of claim 1, wherein the desired process is performed by generating a first plasma over the wafer; after the desired process is completed, generating a second plasma by changing the reaction gas; diffusing the second plasma by moving the confinement assembly; and after the diffusing of the second plasma is completed, de-chucking the wafer.

4. A plasma processing method in a semiconductor manufacturing apparatus, the method comprising:
chucking a wafer within a predetermined region of a process chamber;
generating a plasma within the predetermined region to perform a desired process;
changing an internal pressure of the predetermined region of the process chamber to diffuse charged impurities confined in the plasma to a region outside of the predetermined region in response to completing the desired process; and
removing the wafer from the process chamber including the changed internal pressure of the predetermined region,
wherein the changing the internal pressure of the predetermined region of the process chamber includes increasing a ratio of an inflow rate to an outflow rate of the predetermined region.

5. The plasma processing method of claim 4, wherein the ratio of the inflow rate to the outflow rate of the predetermined region is increased by decreasing a flow rate of a reaction gas flowing in the predetermined region of the process chamber.

6. The plasma processing method of claim 4, wherein the ratio of the inflow rate to the outflow rate of the predetermined region is increased by increasing a flow exhaust amount of the predetermined region of the process chamber.

7. The plasma processing method of claim 4, further comprising changing a reaction gas after completion of the desired process and changing the internal pressure of the predetermined region of the process chamber.

8. The plasma processing method of claim 4, wherein the predetermined region is a region confined by an upper electrode, a support chuck and walls of the process chamber.

9. The plasma processing method of claim 4, wherein the desired process is a dry etching process.

10. A plasma processing method in a semiconductor manufacturing apparatus, the method comprising:
chucking a wafer between an upper electrode and a support chuck of a process chamber;
generating a plasma in a space, the space being disposed among the upper electrode of the process chamber, the wafer, and confinement rings of the process chamber;
arranging the confinement rings of the process chamber at a predetermined interval to limit the space;
performing a desired process using the plasma;
diffusing the plasma to a region outside of the space in response to completing the desired process; and
de-chucking the wafer within the diffused plasma,
wherein diffusing the plasma includes moving the confinement rings.

11. The plasma processing method of claim 10, wherein diffusing the plasma includes moving charged impurities disposed inside the plasma toward a side wall of the process chamber.

12. The plasma processing method of claim 10, wherein moving the confinement rings includes collecting the confinement rings at a side of the upper electrode.

13. The plasma processing of claim 12, wherein collecting the confinement rings includes retracting the confinement rings.

14. The plasma processing method of claim 10, further comprising changing a reaction gas supplying the process chamber into one of Ar, N2 and O2 after the desired process is completed.

* * * * *

UNITED STATES PATENT AND TRADEMARK OFFICE
CERTIFICATE OF CORRECTION

PATENT NO. : 9,048,189 B2  
APPLICATION NO. : 13/044891  
DATED : June 2, 2015  
INVENTOR(S) : Hyun-Su Jun et al.

Page 1 of 1

It is certified that error appears in the above-identified patent and that said Letters Patent is hereby corrected as shown below:

Title Page Item (75) Inventors should read: Hyun-Su Jun, Hwaseong-si (KR);
Ki-Sang Kim, Seongnam-si (KR);
Seung-Heong Lee, Suwon-si (KR);
Jong-Bum Kim, Seoul (KR);
Min-Woong Choi, Yongin-si (KR);
In-Joong Kim, Seoul (KR);

Signed and Sealed this  
Eighth Day of December, 2015

Michelle K. Lee  
*Director of the United States Patent and Trademark Office*